United States Patent
Chen et al.

(10) Patent No.: US 9,887,445 B2
(45) Date of Patent: *Feb. 6, 2018

(54) TUNABLE FILTER

(71) Applicant: Universal Microwave Technology, Inc., Keelung (TW)

(72) Inventors: Yu-Cheng Chen, Taipei (TW); Jen-Ti Peng, Keelung (TW); Chang-Yan Jhuo, New Taipei (TW); Shih-Gong Chiou, Taipei (TW); Yi-Hsien Yang, Taichung (TW)

(73) Assignee: UNIVERSAL MICROWAVE TECHNOLOGY, INC, Keelung (TW)

( * ) Notice: Subject to any disclaimer, the term of this patent is extended or adjusted under 35 U.S.C. 154(b) by 196 days.

This patent is subject to a terminal disclaimer.

(21) Appl. No.: 14/848,253

(22) Filed: Sep. 8, 2015

(65) Prior Publication Data
US 2017/0071080 A1    Mar. 9, 2017

(51) Int. Cl.
*H01P 1/208* (2006.01)
*H01P 7/06* (2006.01)
*H05K 9/00* (2006.01)

(52) U.S. Cl.
CPC .......... *H01P 1/208* (2013.01); *H01P 7/06* (2013.01); *H05K 9/0015* (2013.01)

(58) Field of Classification Search
CPC .......... H01P 1/208; H01P 7/06; H05K 9/0015
USPC ................... 333/202–212, 232, 233
See application file for complete search history.

(56) References Cited

U.S. PATENT DOCUMENTS 6,111,484 A * 8/2000 Henningsson ........ H01P 1/2053
                                              333/207

* cited by examiner

*Primary Examiner* — Rakesh Patel
(74) *Attorney, Agent, or Firm* — Ming Chow; Sinorica, LLC

(57) ABSTRACT

A tunable filter for dynamically setting a filter center frequency includes a movable member, an upper casing, a lower casing, conductive gaskets, a cavity and a driving unit. The movable member includes a board and lugs. The upper casing includes upper openings corresponsive to the lugs respectively. The lower casing includes lower openings corresponsive to the upper openings respectively. The conductive gaskets are disposed between the upper and lower casings. The cavity is combined with the lower casing and has chambers, and the conductive gaskets are corresponsive to the upper and lower openings respectively. The driving unit is coupled to the movable member for moving the lugs in a first direction towards the chambers or in a second direction away from the chambers. The distance moved by the lugs in the first direction or the second direction is used for determining the filter center frequency.

10 Claims, 4 Drawing Sheets

TUNABLE FILTER

FIELD OF THE INVENTION

The present invention relates to the field of communications, in particular to a tunable filter capable of setting the center frequency of the filter.

BACKGROUND OF THE INVENTION

In the conventional manufacturing process of a filter, network analyzers are generally used for measurements, and the center frequency of the filter is adjusted manually. In other words, after the filter is calibrated, the center frequency is fixed and cannot be adjusted by users anymore. Since the filter is packaged, the involved process is very complicated even though the filter can be unpackaged, adjusted, and re-packaged.

After purchasing the filter, purchasers have to send the filter to the original factory to calibrate the center frequency, thus causing tremendous inconvenience to manufacturers. In general, the filters are integrated into related communication equipments, and the filters must be removed from the communication equipments before they can be used as standalone devices. Obviously, such procedure is time-consuming and costly. In another situation, if the communication equipment is a communication base station, signal transmissions of the communication will be affected, or even the base station must be shut down during the process of removing the filters.

In view of the aforementioned drawbacks of the prior art, the present invention provides a tunable filter to overcome the aforementioned drawbacks.

SUMMARY OF THE INVENTION

It is a primary objective of the present invention to provide a tunable filter comprising a movable member, an upper casing, a lower casing, a plurality of conductive gaskets, a cavity and a driving unit, wherein the movable member has a plurality of lugs moved between the upper casing, the lower casing, and the conductive gaskets for dynamically determining a filter center frequency of the tunable filter.

A secondary objective of the present invention is to provide a tunable filter, wherein the conductive gaskets are electrically conductive and disposed between the upper casing and the lower casing, so that the lugs in the cavity have the effect of preventing leakage of electromagnetic waves.

A tertiary objective of the present invention is to provide a tunable filter, wherein the driving unit is provided for receiving a local and/or external control signal to control the movement of the movable member precisely in order to calibrate the filter center frequency precisely and maintain the original frequency response and related characteristics of the tunable filter.

To achieve the aforementioned and other objectives, the present invention provides a tunable filter for dynamically setting a filter center frequency. The tunable filter comprises a movable member, an upper casing, a lower casing, a plurality of conductive gaskets, a cavity and a driving unit. The movable member includes a board and a plurality of lugs formed on a side of the board. The upper casing is disposed on the side of the movable member. The upper casing has a plurality of upper openings configured to be corresponsive to the lugs respectively. The lower casing is disposed on a side of the upper casing. The lower casing has a plurality of lower openings configured to be corresponsive to the upper openings respectively. The conductive gaskets are disposed between the upper casing and the lower casing, and each of the conductive gaskets is proximate to each of the upper openings and each of the lower openings. The cavity is combined with the lower casing. The cavity has a plurality of chambers formed thereon and configured to be corresponsive to the lower openings respectively. Wherein, the chambers are communicated with one another. The driving unit is coupled to the movable member. The driving unit is provided for driving the movable member to move the lugs in a first direction towards the chambers or in a second direction away from the chambers. Wherein, the lugs at the upper openings, the conductive gaskets and the lower openings are moved in the first direction or the second direction to a distance, and the filter center frequency is determined according to the position of the lugs.

Compared with the prior art, the tunable filter of the present invention uses a local and/or external signal to drive the driving unit to adjust the entering or exiting depth of the lug of the movable member with respect to the cavity, so as to achieve the effect of calibrating the filter center frequency dynamically and easily. With the aforementioned objectives, the tunable filter of the present invention may maintain its original frequency response and other functions. In addition, the conductive gaskets of the present invention are provided for preventing the issue of leaking electromagnetic waves.

DESCRIPTION OF THE PREFERRED EMBODIMENTS

The aforementioned and other objects, characteristics and advantages of the present invention will become apparent with the detailed description of the preferred embodiments and the illustration of related drawings as follows.

Figure 1:
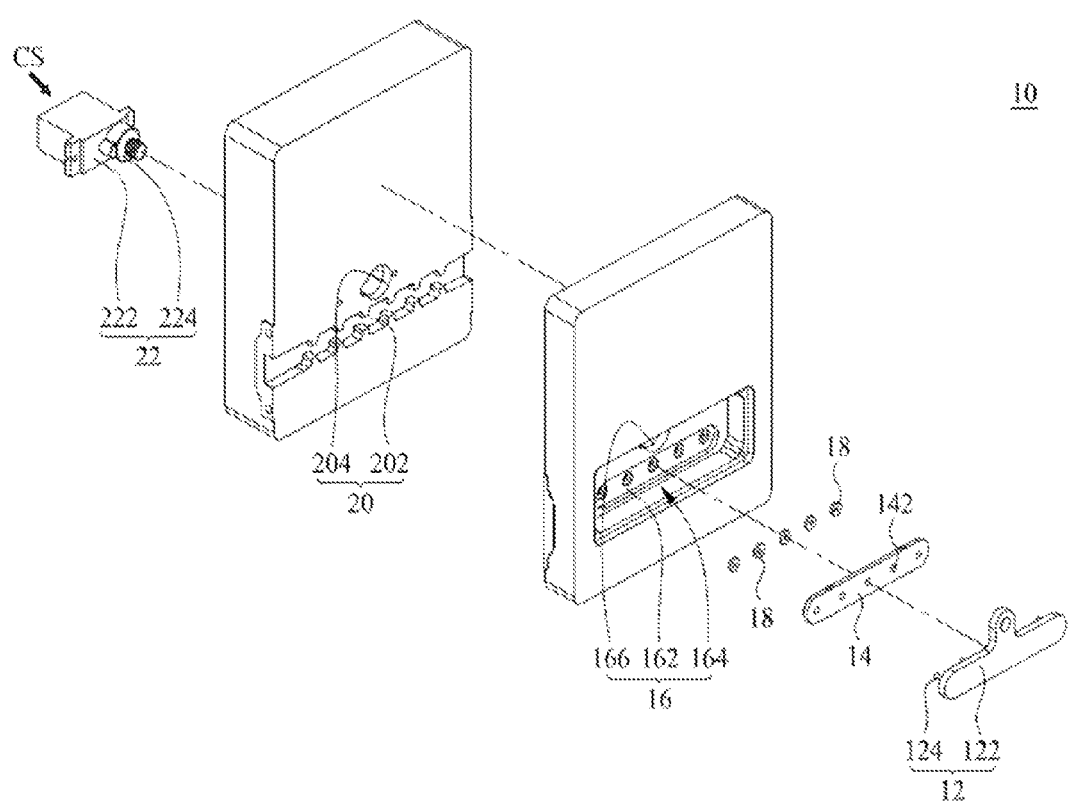
FIG. 1 is a schematic view of a tunable filter in accordance with a preferred embodiment of the present invention.

With reference to FIG. 1 for the schematic view of a tunable filter in accordance with a preferred embodiment of the present invention, the tunable filter 10 is capable of dynamically setting a filter center frequency.

The tunable filter 10 comprises a movable member 12, an upper casing 14, a lower casing 16, a plurality of conductive gaskets 18, a cavity 20 and a driving unit 22.

The movable member 12 includes a board 122 and a plurality of lugs 124. The board 122 is a T-shape board. In other embodiments, the shape of the board 122 is not limited to a rectangular shape. The lugs 124 are formed at the bottom of the board 122. In this embodiment, the lugs 124 are of the same length. In other embodiments, the lugs 124 may be unequal lengths or adjusted as needed.

The upper casing 14 is disposed at the bottom of the movable member 12. The upper casing 14 has a plurality of upper openings 142 configured to be corresponsive to the lugs 124 respectively.

The lower casing 16 is disposed at the bottom of the upper casing 14. The lower casing 16 has a plurality of lower openings 162 configured to be corresponsive to the upper openings 142. In this embodiment, the lower casing 16 has containing space 164 formed therein and provided for containing the movable member 12, the upper casing 14, and the conductive gaskets 18.

The conductive gaskets 18 are disposed between the upper casing 14 and the lower casing 16 and configured to be corresponsive to the upper openings 142 and the lower openings 162 respectively. Wherein, the conductive gaskets 18 are made of a conductive material. The conductive gaskets 18 may be O-shape gaskets. In this embodiment, the conductive gaskets 18 are clamped between the upper casing 14 and the lower casing 16. The size of the conductive gaskets 18 is smaller than or equal to the diameter of the lugs 124. After the lugs 124 are plugged with the conductive gaskets 18, the lugs 124 are closely clamped with the conductive gaskets 18 to prevent electromagnetic waves from leaking out from the cavity 20.

The cavity 20 is combined with the lower casing 16. The cavity 20 has a plurality of chambers 202 formed therein and configured to be corresponsive to the lower openings 162 respectively. Wherein, the chambers 202 are communicated with one another. In this embodiment, the cavity 20 is in a circular shape, and communicated in form of a rectangular shape. In other embodiments, the shape is not limited to that as disclosed in the aforementioned embodiment.

Figure 2:
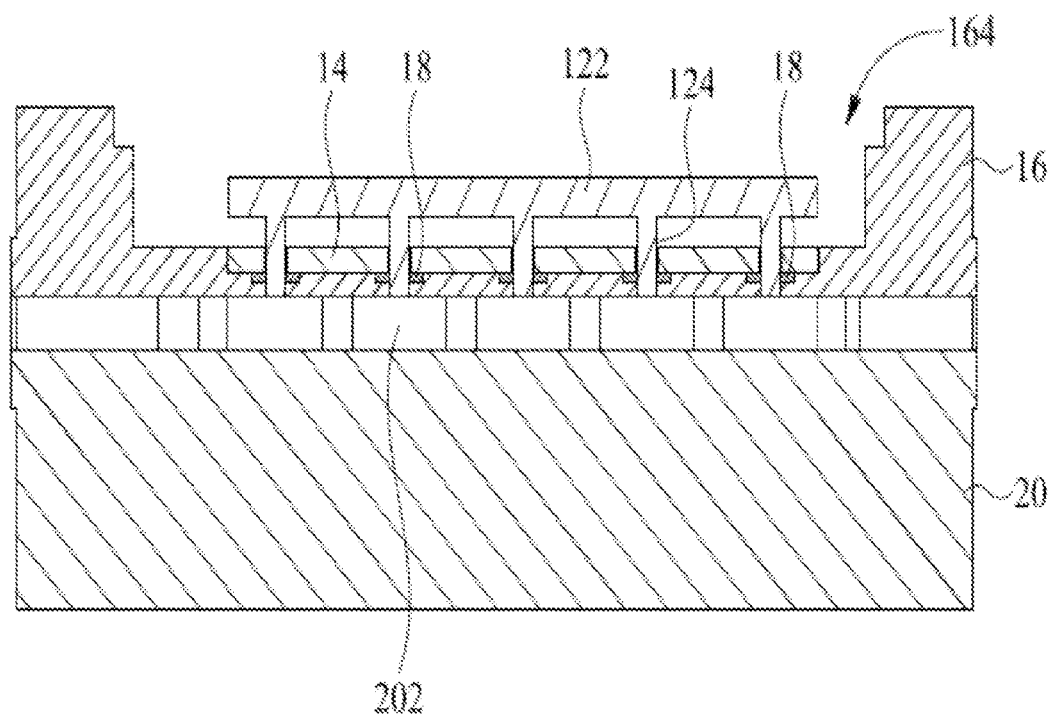
FIG. 2 is a cross-sectional view showing a movable member, an upper casing, a lower casing, a plurality of conductive gaskets and a cavity combined with the tunable filter depicted in FIG. 1.

With reference to FIG. 2 for a cross-sectional view showing a movable member 12, an upper casing 14, a lower casing 16, a plurality of conductive gaskets 18 and a cavity 20 combined with the tunable filter of the present invention, the driving unit 22 is coupled to the movable member 12 and provided for driving the movable member 12, so that the lugs 124 are moved in −Y direction towards the chambers 202 or in +Y direction away from the chambers 202. In this embodiment, the driving unit 22 may be a motor 222 and a link rod 224. The motor 222 is coupled to the link rod 224, and the link rod 224 is coupled to the movable member 12. The motor 222 receives a control signal CS to drive the link rod 224 to move, so as to adjust the movement to a distance in the −Y direction towards the chambers 202 or in the +Y direction away from the chambers 202. Wherein, the driving unit 22 is either a servo motor or a stepper motor.

In this embodiment, the lower casing 16 has an upper hole 166 and the cavity 20 has a lower hole 204. The link rod 224 is passed through the upper hole 166 and the lower hole 204 to connect the board 122.

Figure 3:
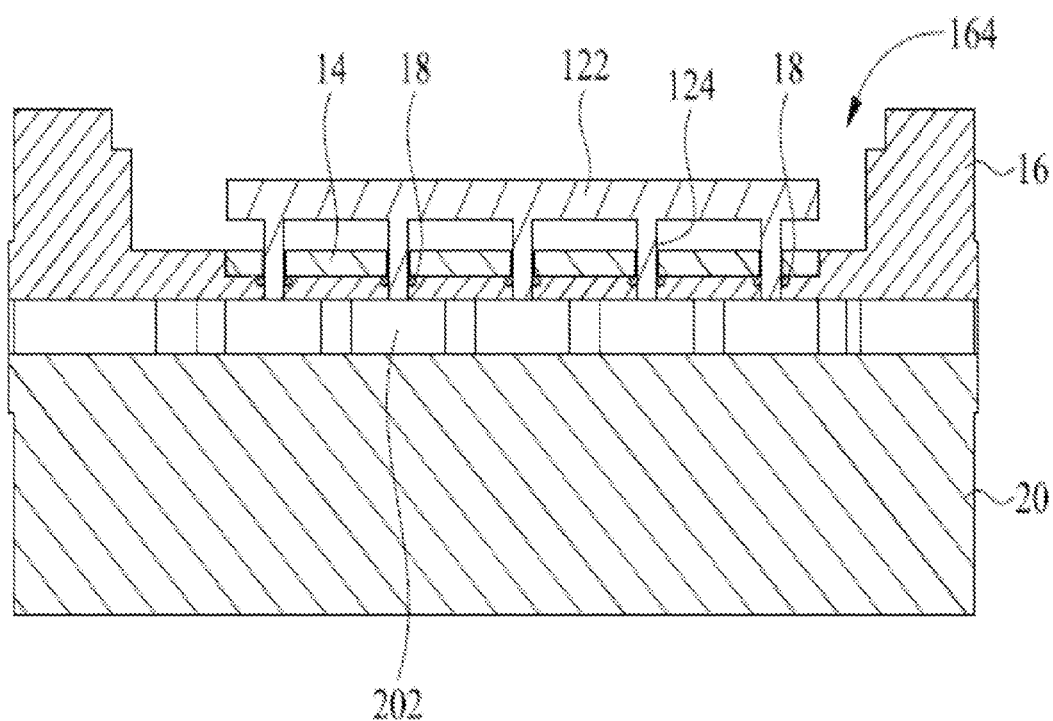
FIG. 3 is another cross-sectional view showing an upper casing, a lower casing and a plurality of conductive gaskets combined with the tunable filter of the foregoing preferred embodiment.
Figure 4:
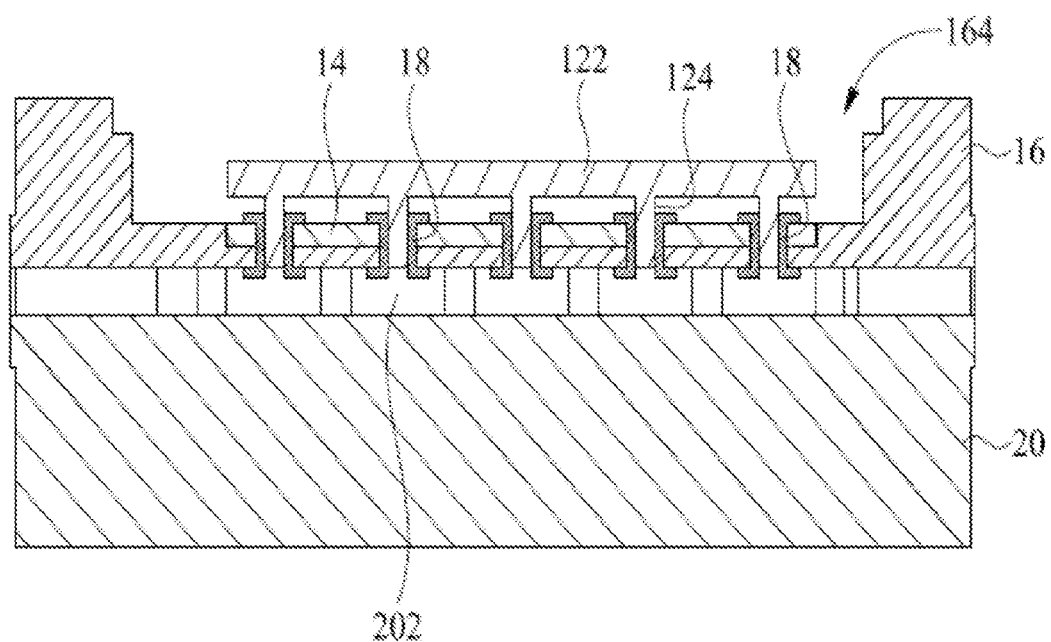
FIG. 4 is a further cross-sectional view showing an upper casing, a lower casing and a plurality of conductive gaskets combined with the tunable filter of the foregoing preferred embodiment.

With reference to FIGS. 3 and 4 for other cross-sectional views showing an upper casing, a lower casing and a plurality of conductive gaskets of the aforementioned embodiment, the upper casing 14 and the lower casing 16 are integrally formed as shown in FIG. 3, and the upper openings 142 is communicated with the lower openings 162. A notch is formed at the upper openings 142 and the lower openings 162 separately for containing the conductive gaskets 18, so as to achieve the aforementioned effect.

In FIG. 4, the upper casing 14 and the lower casing 16 are covered by the conductive gaskets 18, so as to achieve the aforementioned effect.

While the invention has been described by means of specific embodiments, numerous modifications and variations could be made thereto by those skilled in the art without departing from the scope and spirit of the invention set forth in the claims.

What is claimed is:

1. A tunable filter, for dynamically setting a filter center frequency, comprising:
   a movable member, having a board, and a plurality of lugs formed on a side of the board;
   an upper casing, installed to a side of the movable member, and having a plurality of upper openings configured to be corresponsive to the plurality of lugs respectively;
   a lower casing, disposed on a side of the upper casing, and having a plurality of lower openings configured to be corresponsive to the plurality of upper openings respectively;
   a plurality of conductive gaskets, disposed between the upper casing and the lower casing, and the plurality of conductive gaskets being configured to be corresponsive to the plurality of upper openings and the plurality of lower openings respectively;
   a cavity, combined with the lower casing, and having a plurality of chambers formed therein and configured to be corresponsive to the plurality of lower openings respectively, and the plurality of chambers communicating with one another;
   a driving unit, coupled to the movable member, for driving the movable member to move the plurality of lugs in a first direction towards the plurality of chambers or in a second direction away from the plurality of chambers; and
   the plurality of lugs at the plurality of upper openings, the plurality of conductive gaskets and the plurality of lower openings being moved a distance in the first direction or the second direction, a position of the plurality of lugs being used for determining the filter center frequency.

2. The tunable filter as claimed in claim 1, wherein the plurality of conductive gaskets have a size that is not greater than a diameter of the plurality of lugs.

3. The tunable filter as claimed in claim 1, wherein the driving unit further comprises a motor and a link rod, and the motor is coupled to the link rod, and the link rod is coupled to the movable member, and the motor receives a control signal to drive the link rod to move, so as to adjust the distance in the first direction or the second direction.

4. The tunable filter as claimed in claim 3, wherein the motor is one selected from the group consisting of a servo motor and a stepper motor.

5. The tunable filter as claimed in claim 4, wherein the lower casing has a containing space formed therein and provided for containing the movable member, the upper casing, and the plurality of conductive gaskets.

6. The tunable filter as claimed in claim 5, wherein the lower casing has an upper hole formed thereon, and the link rod is passed through the upper hole to connect the board.

7. The tunable filter as claimed in claim 5, wherein the lower casing has an upper hole formed thereon, and the cavity has a lower hole formed thereon, and the link rod is passed through the upper hole and the lower hole to connect the board.

8. The tunable filter as claimed in claim 1, wherein the upper casing and the lower casing are integrally formed, and the plurality of upper openings are communicated with the plurality of lower openings respectively.

9. The tunable filter as claimed in claim 8, wherein the plurality of conductive gaskets are disposed in the plurality of upper openings and the plurality of lower openings.

10. The tunable filter as claimed in claim 8, wherein the plurality of conductive gaskets cover the upper casing and the lower casing.

* * * * *